US012757618B2

(12) United States Patent
Wang et al.

(10) Patent No.: US 12,757,618 B2
(45) Date of Patent: Oct. 6, 2026

(54) DISPLAY DEVICE, DISPLAY PANEL AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunhao Wang, Beijing (CN); Puyu Qi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 699 days.

(21) Appl. No.: 17/914,781

(22) PCT Filed: Aug. 27, 2021

(86) PCT No.: PCT/CN2021/114883
§ 371 (c)(1),
(2) Date: Sep. 27, 2022

(87) PCT Pub. No.: WO2023/024053
PCT Pub. Date: Mar. 2, 2023

(65) Prior Publication Data
US 2024/0357911 A1 Oct. 24, 2024

(51) Int. Cl.
*H10K 59/80* (2023.01)
*H10K 59/12* (2023.01)
(Continued)

(52) U.S. Cl.
CPC ..... *H10K 59/8791* (2023.02); *H10K 59/1201* (2023.02); *H10K 59/131* (2023.02);
(Continued)

(58) Field of Classification Search
CPC ........................... H10K 59/40; H10K 59/8791
See application file for complete search history.

(56) References Cited

U.S. PATENT DOCUMENTS

| | | | |
|---|---|---|---|
| 7,067,985 | B2 | 6/2006 | Adachi |
| 7,425,794 | B2 | 9/2008 | Adachi |

(Continued)

FOREIGN PATENT DOCUMENTS

| | | | |
|---|---|---|---|
| CN | 1591101 | A | 3/2005 |
| CN | 104637973 | A | 5/2015 |

(Continued)

OTHER PUBLICATIONS

Written Opinion from PCT/CN2021/114883 dated Jun. 6, 2022.
International Search Report from PCT/CN2021/114883 dated Jun. 6, 2022.

*Primary Examiner* — Eric K Ashbahian
(74) *Attorney, Agent, or Firm* — Calfee, Halter & Griswold LLP

(57) ABSTRACT

The present disclosure provides a display device, including: a driving backplane; a light emitting layer, disposed on a side of the driving backplane, and including a plurality of light emitting devices that include a first light emitting device emitting light of a first color; a chiral liquid crystal layer, disposed on a side of the light emitting layer away from the driving backplane, and configured to transmit circularly polarized light of the first color in a first handedness and reflect circularly polarized light of the first color in a second handedness; and a circularly polarization layer, disposed on a side of the chiral liquid crystal layer away from the driving backplane, and configured to convert light incident from a side of the circularly polarization layer away from the driving backplane into the circularly polarized light in the first handedness.

7 Claims, 9 Drawing Sheets

(51) Int. Cl.

| | |
|---|---|
| ***H10K 59/131*** | (2023.01) |
| ***H10K 59/35*** | (2023.01) |
| ***H10K 59/38*** | (2023.01) |
| ***H10K 59/40*** | (2023.01) |
| ***H10K 59/50*** | (2023.01) |
| ***H10K 59/60*** | (2023.01) |
| *H10K 102/00* | (2023.01) |

(52) U.S. Cl.

CPC ........... *H10K 59/352* (2023.02); *H10K 59/38* (2023.02); *H10K 59/40* (2023.02); *H10K 59/50* (2023.02); *H10K 59/60* (2023.02); *H10K 59/8731* (2023.02); *H10K 2102/351* (2023.02)

(56) References Cited

U.S. PATENT DOCUMENTS

| | | | | |
|---|---|---|---|---|
| 7,557,494 | B2 | 7/2009 | Adachi | |
| 7,732,809 | B2 | 6/2010 | Adachi et al. | |
| 7,928,639 | B2 | 4/2011 | Adachi | |
| 8,198,804 | B2 | 6/2012 | Adachi | |
| 8,368,080 | B2 | 2/2013 | Adachi et al. | |
| 9,647,041 | B2 | 5/2017 | Liu et al. | |
| 10,490,609 | B2 | 11/2019 | Liu et al. | |
| 10,700,309 | B2 | 6/2020 | Kim et al. | |
| 2004/0051445 | A1 | 3/2004 | Adachi | |
| 2005/0035353 | A1* | 2/2005 | Adachi | H10K 59/8791 257/E27.111 |
| 2006/0028146 | A1 | 2/2006 | Adachi | |
| 2008/0007155 | A1 | 1/2008 | Adachi | |
| 2009/0072731 | A1 | 3/2009 | Adachi | |
| 2009/0161051 | A1* | 6/2009 | Fukunaga | G06F 3/0412 349/115 |
| 2010/0072880 | A1 | 3/2010 | Adachi et al. | |
| 2011/0163333 | A1 | 7/2011 | Adachi et al. | |
| 2014/0159018 | A1* | 6/2014 | Song | H10K 59/878 257/40 |
| 2014/0204300 | A1* | 7/2014 | Park | G02F 1/133377 438/30 |
| 2015/0169094 | A1 | 6/2015 | Liu et al. | |
| 2015/0331288 | A1* | 11/2015 | Hsieh | G02F 1/1368 349/12 |
| 2016/0079089 | A1* | 3/2016 | Koezuka | H01L 21/02172 438/104 |
| 2017/0213874 | A1 | 7/2017 | Liu et al. | |
| 2018/0006274 | A1 | 1/2018 | Kim et al. | |
| 2019/0157354 | A1* | 5/2019 | Lee | H10K 50/84 |
| 2021/0334504 | A1* | 10/2021 | Lu | H10F 39/8053 |
| 2021/0359008 | A1* | 11/2021 | Zhang | G02B 5/223 |
| 2023/0097671 | A1* | 3/2023 | Wang | G06F 3/0412 345/173 |

FOREIGN PATENT DOCUMENTS

| | | | |
|---|---|---|---|
| CN | 107564933 | A | 1/2018 |
| CN | 112271197 | A | 1/2021 |
| CN | 113433729 | A | 9/2021 |
| GB | 2551863 | A | 1/2018 |
| GB | 2551863 | B | 5/2020 |

* cited by examiner

DISPLAY DEVICE, DISPLAY PANEL AND MANUFACTURING METHOD THEREOF

CROSS REFERENCE

The present application is the 371 application of PCT Application No. PCT/CN2021/114883, filed on Aug. 27, 2021, the entire contents of which are incorporated herein by reference.

TECHNICAL FIELD

The present disclosure relates to the field of display technologies, and in particular, to a display device, a display panel and a manufacturing method for a display panel.

BACKGROUND

At present, display panels have become indispensable components of electronic devices such as mobile phones and computers. In order to avoid reflection of external light by the display panels to lead to low visibility, the existing display panels are generally provided with circularly polarization plates accordingly to reduce the reflection of the external light.

It should be noted that the information disclosed in the Background section above is only for enhancing the understanding of the background of the present disclosure, and thus may include information that does not constitute prior art known to those of ordinary skill in the art.

SUMMARY

The present disclosure provides a display device, a display panel and a manufacturing method for a display panel.

According to an aspect of the present disclosure, there is provided a display panel, including:

a driving backplane;

a light emitting layer, disposed on a side of the driving backplane, and including a plurality of light emitting devices that include a first light emitting device by which light of a first color is emitted;

a chiral liquid crystal layer, disposed on a side of the light emitting layer away from the driving backplane, wherein the chiral liquid crystal layer is configured to transmit circularly polarized light of the first color in a first handedness and reflect circularly polarized light of the first color in a second handedness, and the first handedness is opposite to the second handedness; and a circularly polarization layer, disposed on a side of the chiral liquid crystal layer away from the driving backplane, wherein the circularly polarization layer is configured to convert light incident from a side of the circularly polarization layer away from the driving backplane into the circularly polarized light in the first handedness, and convert light incident from a side of the circularly polarization layer close to the light emitting devices into linearly polarized light.

According to an aspect of the present disclosure, there is provided a manufacturing method for a display panel, including:

forming a driving backplane;

forming a light emitting layer on a side of the driving backplane, wherein the light emitting layer includes a plurality of light emitting devices including a first light emitting device by which light of a first color is emitted;

2 forming a chiral liquid crystal layer on a side of the light emitting layer away from the driving backplane, wherein the chiral liquid crystal layer is configured to transmit circularly polarized light of the first color in a first handedness and reflect circularly polarized light of the first color in a second handedness, and the first handedness is opposite to the second handedness; and forming a circularly polarization layer on a side of the chiral liquid crystal layer away from the driving backplane, wherein the circularly polarization layer is configured to convert light incident from a side of the circularly polarization layer away from the driving backplane into the circularly polarized light in the first handedness, and convert light incident from a side of the circularly polarization layer close to the light emitting device into linearly polarized light.

According to an aspect of the present disclosure, there is provided a display device, including the display panel described in any one of the above embodiments.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
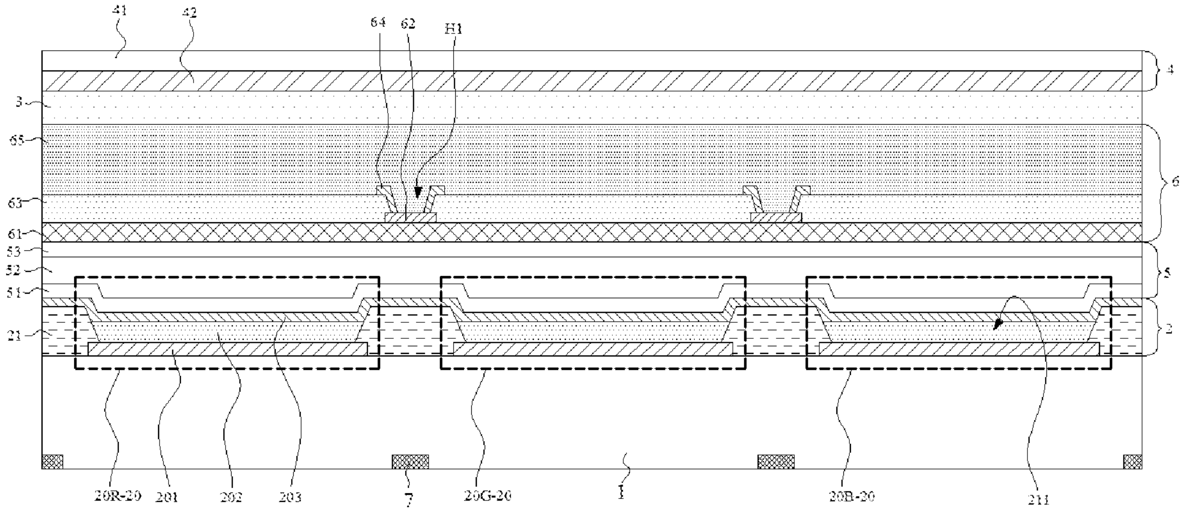
FIG. 1 is a schematic diagram of a first embodiment of a display panel of the present disclosure.

Embodiments will now be described more fully with reference to the drawings. However, the embodiments can be implemented in a variety of forms and should not be construed as being limited to examples set forth herein; rather, these embodiments are provided so that the present disclosure will be more full and complete so as to convey the idea of the embodiments to those skilled in this art. The same reference signs in the drawings denote the same or similar structures, and the detailed description thereof will be omitted. In addition, the drawings are merely schematic representations of the present disclosure and are not necessarily drawn to scale.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

Embodiments of the present disclosure provide a display panel, which may be an Organic Light Emitting Diode (OLED) display panel. As shown in FIG. 1, the display panel of the present disclosure may include a driving backplane 1, a light emitting layer 2, a chiral liquid crystal layer 3 and a circularly polarization layer 4.

The light emitting layer 2 is disposed on a side of the driving backplane 1, and includes a plurality of light emitting devices 20 which include a first light emitting device 20B that emits light of a first color.

The chiral liquid crystal layer 3 is disposed on a side of the light emitting layer 2 away from the driving backplane 1, and is configured to transmit circularly polarized light of the first color in a first handedness and reflect circularly polarized light of the first color in a second handedness. The first handedness is opposite to the second handedness.

The circularly polarization layer 4 is disposed on a side of the chiral liquid crystal layer 3 away from the driving backplane 1, and is configured to convert light incident from a side of the circularly polarization layer 4 away from the driving backplane 1 into the circularly polarized light in the first handedness, and convert light incident from a side of the circularly polarization layer 4 close to the light emitting device 20 into linearly polarized light.

Figure 11:
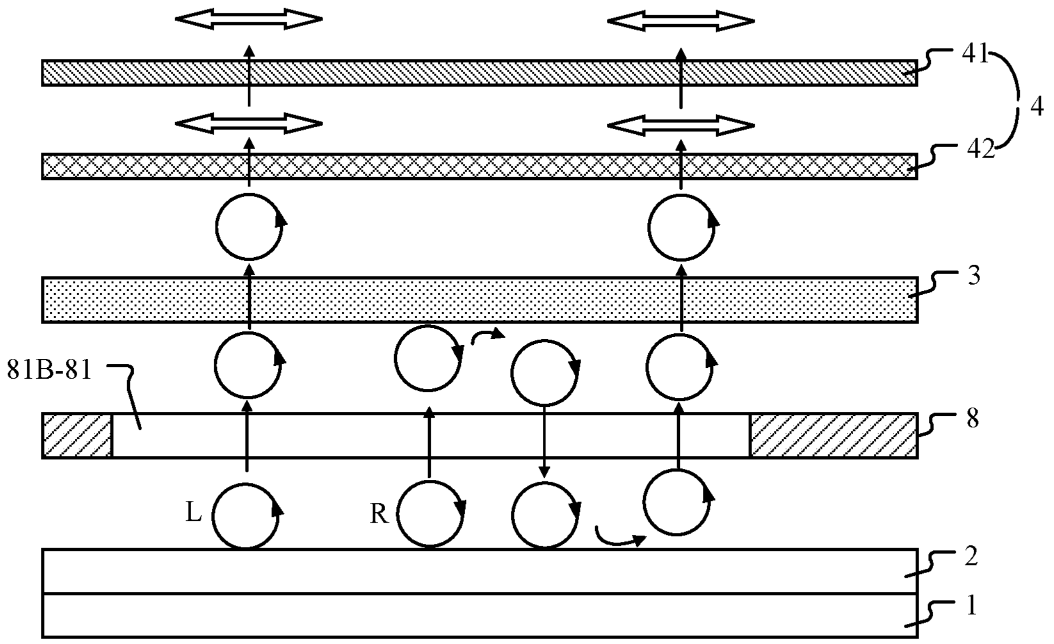
FIG. 11 is a schematic diagram of a principle of improving light extraction efficiency in an embodiment of a display panel of the present disclosure.
Figure 12:
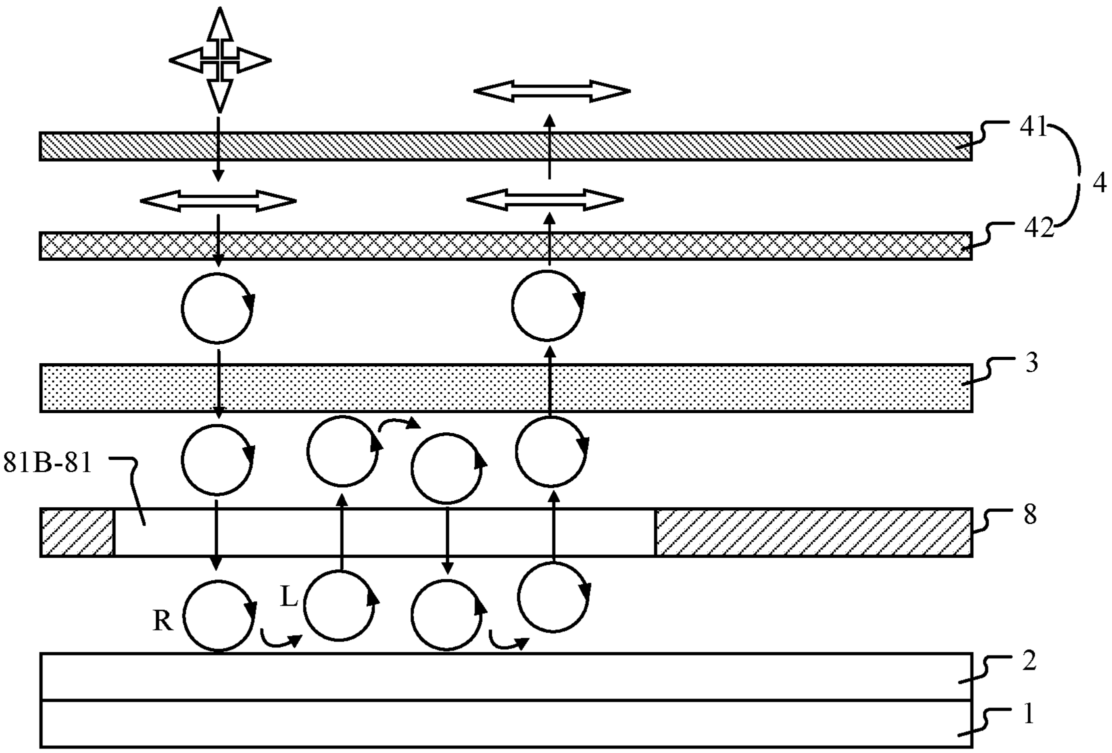
FIG. 12 is a schematic diagram of a principle of reducing reflection of ambient light in an embodiment of a display panel of the present disclosure.

As shown in FIG. 11 and FIG. 12, the display panel of the embodiments of the present disclosure has at least the following beneficial effects.

For ambient light, when the ambient light propagates toward the driving backplane 1 from the side of the circularly polarization layer 4 away from the driving backplane 1, part of the light can be absorbed by the circularly polarization layer 4, and only the circularly polarized light in the first handedness can be transmitted by the circularly polarization layer 4, reducing the ambient light that can be received by the light emitting layer 2 and the driving backplane 1, so that a purpose of reducing the reflection of the ambient light by the display panel is achieved, and a display effect is improved.

For the light emitted by the light emitting device 20, the chiral liquid crystal layer 3 can transmit the circularly polarized light of the first color in the first handedness, and reflect the circularly polarized light of the first color in the second handedness. After the circularly polarized light of the first color in the second handedness are reflected between the chiral liquid crystal layer 3 and the light emitting layer 2 and between the chiral liquid crystal layer 3 and the driving backplane 1 multiple times, it can change the handedness, so that the circularly polarized light of the first color in the second handedness can be converted into the circularly polarized light of the first color in the first handedness to be transmitted by the chiral liquid crystal layer 3 and the circularly polarization layer 4 to be emitted, thereby improving light extraction efficiency of the light of the first color emitted by the first light emitting device 20B.

Whereby the light extraction efficiency can be improved while reducing the reflection.

Each portion of the display panel of the present disclosure will be described in detail below.

As shown in FIG. 1, the driving backplane 1 has a driving circuit, which can be configured to drive each light emitting device 20 of the light emitting layer 2 to emit the light independently to display an image. In addition, the driving backplane 1 may include a pixel area and a peripheral area located outside the pixel area, for example, the peripheral area may be a continuous or discontinuous annular area surrounding the pixel area.

The driving circuit may include a pixel circuit and a peripheral circuit. At least a part of the pixel circuit is disposed in the pixel area, and in addition, there may be a part of the pixel circuit in the peripheral area. The pixel circuit may have a structure such as 7T1C, 7T2C, 6T1C or 6T2C, as long as it can drive the light emitting device 20 to emit the light, and there is no special restriction on the structure of the pixel circuit here. The number of pixel circuits is the same as the number of light emitting devices 20, and the pixel circuits are coupled with individual light emitting devices 20 in a one-to-one correspondence, so as to control the individual light emitting devices 20 to independently emit the light respectively. nTmC represents a pixel circuit includes n transistors (represented by a letter "T") and m capacitors (represented by a letter "C"). It should be noted that one pixel circuit can also simultaneously drive the plurality of light emitting devices 20 to emit the light.

The peripheral circuit is located in the peripheral area, and is coupled with the pixel circuit for inputting a driving signal to the pixel circuit, so as to control the light emitting device 20 to emit the light. The peripheral circuit may include a gate driving circuit, a source driving circuit, a light emitting control circuit, etc. . . . In addition, the peripheral circuit may also include other circuits, and a specific structure of the peripheral circuit is not specially limited herein.

The driving backplane 1 may be formed of a plurality of film layers. For example, the driving backplane 1 may include a substrate and a driving layer disposed on a side of the substrate, the substrate may be a single-layer or multi-layer structure, and may have a rigid or flexible structure, which is not particularly limited here. The above-mentioned driving circuit may be located in the driving layer, and taking a transistor in the driving circuit as a top-gate thin film transistor as an example, the driving layer may include an active layer, a first gate insulating layer, a gate, a second gate insulating layer, an interlayer dielectric layer, a first source-drain layer, a passivation layer, a first planarization layer, a second source-drain layer and a second planarization layer.

The active layer is disposed on the substrate, and the first gate insulating layer covers the active layer. The gate is disposed on a surface of the first gate insulating layer away from the substrate, and is disposed exactly opposite to the active layer. The second gate insulating layer covers the gate and the first gate insulating layer, and the interlayer dielectric layer covers the second gate insulating layer. The first source-drain layer is disposed on a surface of the interlayer dielectric layer away from the substrate and includes a source and a drain, and the source and the drain are coupled to the active layer. The passivation layer covers the first source-drain layer, and the first planarization layer covers the passivation layer. The second source-drain layer is disposed on a surface of the first planarization layer away from the substrate, and is coupled with the first source-drain layer. The second planarization layer covers the second source-drain layers and the first planarization layer.

As shown in FIG. 1, the light emitting layer 2 is disposed on the side of the driving backplane 1, for example, the light emitting layer 2 is disposed on a surface of the driving layer away from the substrate. The light emitting layer 2 may include the plurality of light emitting devices 20 distributed in an array in the pixel area and a pixel definition layer 21 defining each light emitting device 20.

The pixel definition layer 21 can be disposed on the side of the driving backplane 1, for example, the pixel definition layer 21 is disposed on a surface of the second planarization layer away from the substrate. The pixel definition layer 21 is used to separate individual light emitting devices 20. Specifically, the pixel definition layer 21 may be provided with a plurality of openings 211, and a range defined by each opening 211 is a range of one light emitting device 20. A shape of the opening 211, that is, an outline shape of an orthographic projection of the opening 211 on the driving backplane 1 may be a polygon, a smooth closed curve or other shapes, and the smooth closed curve may be a circle, an ellipse or a waist circle, etc., which is not specially limited here.

The light emitting devices 20 may be coupled to respective pixel circuits in a one-to-one correspondence, or the plurality of light emitting devices 20 may be coupled to the same pixel circuit, so as to emit the light under driving of the driving circuit. For example, the light emitting device 20 can be coupled to the second source-drain layer, and can emit the light under the driving of the driving circuit.

Taking the light emitting device 20 as an OLED as an example, the light emitting device 20 may include a first electrode 201, a light emitting functional layer 202 and a second electrode 203 stacked in sequence along a direction away from the driving backplane 1.

The first electrode 201 can be disposed on the same surface of the driving backplane 1 as the pixel definition layer 21, and can be used as an anode of the light emitting device 20. Respective openings 211 of the pixel definition layer 21 expose respective first electrodes 201 in a one-to-one correspondence. The first electrode 201 may be a single-layer or multi-layer structure, and its material may include one or more of conductive metals, metal oxides and alloys.

The light emitting functional layer 202 is at least partially disposed in the opening 211, and may include a hole injection layer, a hole transport layer, a light emitting material layer, an electron transport layer and an electron injection layer sequentially stacked along the direction away from the driving backplane 1. Holes and electrons recombine into excitons in the light emitting material layer, and the excitons radiate photons, thereby generating visible light. A specific light emitting principle will not be described in detail here.

Further, as shown in FIG. 1, light emitting functional layers 202 of the individual light emitting devices 20 may be independent of each other, and are distributed in an array in the individual openings 211, that is, light emitting functional layers 202 of different light emitting devices 20 are independent of each other.

The second electrode 203 can cover the light emitting functional layer 202, and can be used as a cathode of the light emitting device 20. The second electrode 203 can be a single-layer or multi-layer structure, and its material can include one or more of conductive metals, metal oxides and alloys.

Further, as shown in FIG. 1, the individual light emitting devices 20 may share the same second electrode 203. Specifically, the second electrode 203 is a continuous conductive layer covering the light emitting functional layer 202 of each light emitting device 20 and the pixel definition layer 21, that is, an orthographic projection of the second electrode 203 on the pixel definition layer 21 covers each opening 211.

Figure 16:
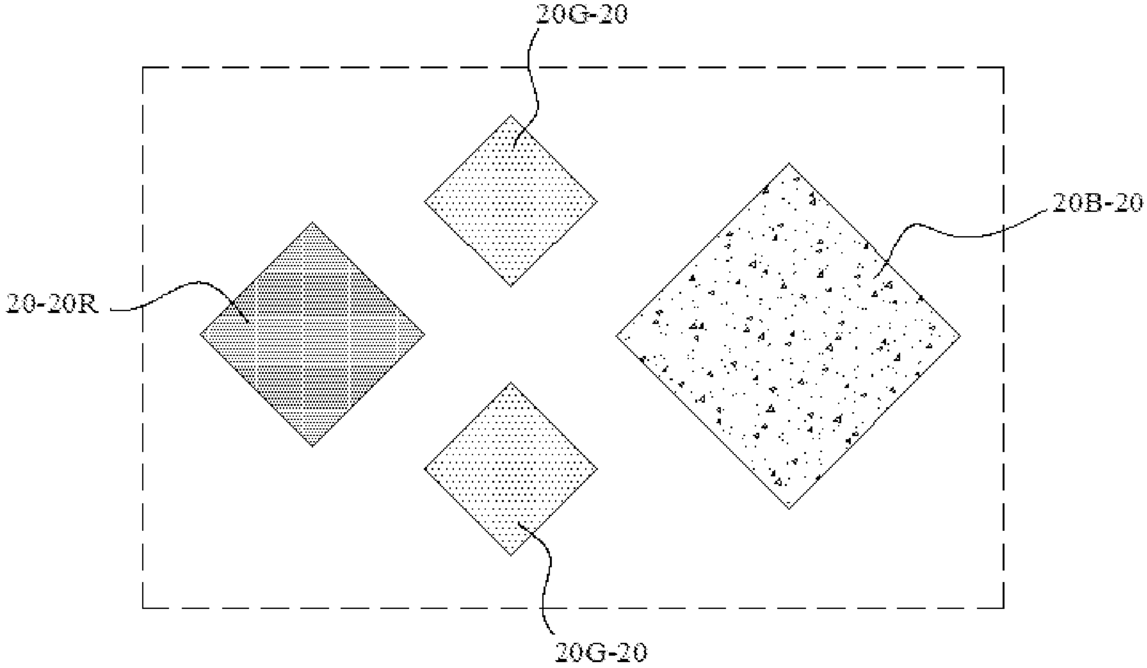
FIG. 16 is a schematic diagram of distribution of some light emitting devices in an embodiment of a display panel of the present disclosure.
Figure 17:
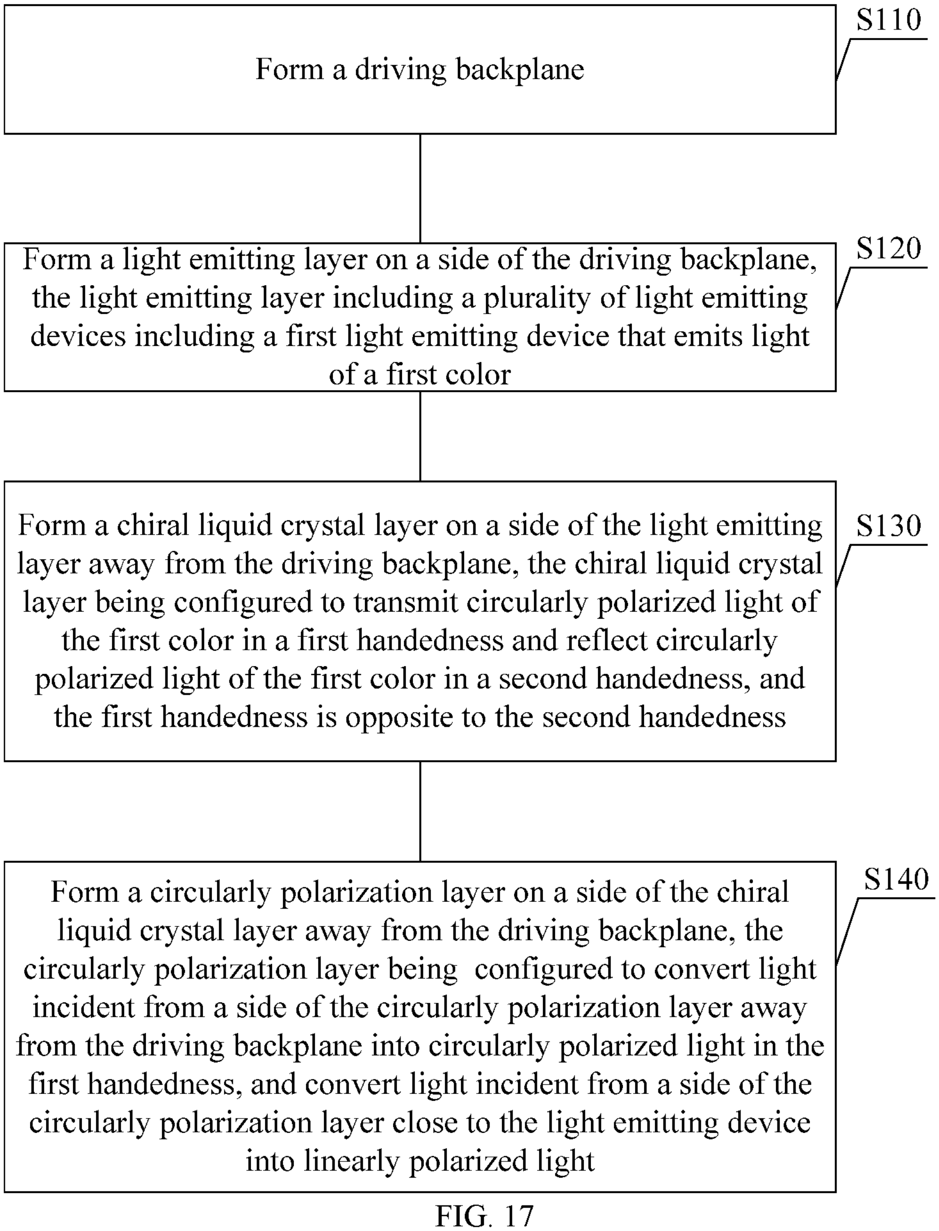
FIG. 17 is a flowchart of a manufacturing method for a display panel according to an embodiment of the present disclosure.

In some embodiments of the present disclosure, as shown in FIG. 16, the light emitting devices 20 of the light emitting layer 2 may include the first light emitting device 20B, a second light emitting device 20R and a third light emitting device 20G that emit the light of different colors, the first light emitting device 20B can emit the light of the first color, the second light emitting device 20R can emit light of a second color, and the third light emitting device 20G can emit light of a third color.

The individual light emitting devices 20 can be divided into a plurality of pixels, and each pixel includes the plurality of light emitting devices 20. For example, each pixel can include three light emitting devices 20 that emit the light of different colors, and the three light emitting devices 20 are the first light emitting device 20B, the second light emitting device 20R and the third light emitting device 20G, respectively. For example, the first color may be blue, the second color may be red, and the third color may be green.

In other embodiments of the present disclosure, the light emitting layer may include a light emitting unit layer and a color filter layer on a side of the light emitting unit layer away from the driving backplane 1.

The light emitting unit layer may include a plurality of light emitting units that have the same structure as the light emitting device above, that is, the light emitting unit may have an OLED structure. However, in addition to sharing the second electrode, individual light emitting units may also share the light emitting function layer, in order to simplify a process, and correspondingly, the individual light emitting units emit the light of the same color. The color filter layer may include filter portions disposed in a one-to-one correspondence with the light emitting units, and colors of the light transmitted by different filter portions may be different, so that a color display can be realized by the cooperation of the light emitting units and the filter portions. One light emitting unit and the corresponding filter portion can be used to form one light emitting device.

It should be noted that in other embodiments of the present disclosure, the color filter layer can also be replaced by a quantum dot layer, as long as the color display can be realized under the driving of the light emitting unit. One light emitting unit and the corresponding quantum dot layer can be used to form one light emitting device.

In addition, as shown in FIG. 1, in some embodiments of the present disclosure, the display panel may further include an encapsulation layer 5.

The encapsulation layer 5 covers a surface of the light emitting layer 2 away from the driving backplane 1, and can be used to protect the light emitting layer 2 and block external water and oxygen from eroding the light emitting device 20.

In some embodiments of the present disclosure, the encapsulation may be implemented by means of Thin-Film Encapsulation (TFE). Specifically, the encapsulation layer 5 may include a first inorganic layer 51, an organic layer 52 and a second inorganic layer 53. The first inorganic layer 51 covers the surface of the light emitting layer 2 away from the driving backplane 1, for example, the first inorganic layer 51 may cover the second electrode 203. The organic layer 52 can be disposed on a surface of the first inorganic layer 51 away from the driving backplane 1, a boundary of the organic layer 52 is limited to inside of a boundary of the first inorganic layer 51, and a boundary of an orthographic projection of the organic layer 52 on the driving backplane 1 may be located in the peripheral area, ensuring that the organic layer 52 can cover each light emitting device 20. The second inorganic layer 53 can cover the organic layer 52 and the first inorganic layer 51 not covered by the organic layer 52. The second inorganic layer 53 can block water and oxygen intrusion, and the organic layer 52 with flexibility can achieve planarization.

In addition, as shown in FIGS. 1 and 13-15, in some embodiments of the present disclosure, the display panel may further include a touch layer 6, which can be disposed on the side of the light emitting layer 2 away from the driving backplane 1, for example, the touch layer 6 can be disposed on a surface of the encapsulation layer 5 away from the driving backplane 1. The touch layer 6 is configured to sense a touch operation to determine a touch position, so that a light emitting state of the light emitting device 20 is controlled according to the touch position. The touch layer 6 may adopt a self-capacitance or mutual-capacitance structure. In addition, the touch layer 6 may also have a resistive structure, and the specific structure of the touch layer 6 is not specially limited herein.

Taking the touch layer 6 with the mutual-capacitance structure as an example, in some embodiments of the present disclosure, as shown in FIGS. 1 and 13-15, the touch layer 6 may include a buffer layer 61, a first conductive layer 62, an isolation layer 63, a second conductive layer 64 and a protective layer 65.

The buffer layer 61 can be disposed on the surface of the encapsulation layer 5 away from the driving backplane 1, and a material of the buffer layer 61 can be an inorganic insulating material such as silicon oxide and silicon nitride. The inorganic insulating material may be deposited on the encapsulation layer 5 by chemical vapor deposition or other processes.

The first conductive layer 62 can be disposed on a surface of the buffer layer 61 away from the driving backplane 1.

The isolation layer 63 covers the first conductive layer 62, a material of the isolation layer 63 is an insulating material, and the isolation layer 63 is provided with a via hole H exposing a partial area of the first conductive layer 62. There may be a plurality of via holes H.

The second conductive layer 64 can be disposed on a surface of the isolation layer 63 away from the driving backplane 1, and is coupled to the first conductive layer 62 through the via hole H.

The protective layer 65 can cover the second conductive layer 64 and the isolation layer 63, and a material of the protective layer 65 can be optical glue or an insulating material such as acrylic.

Figure 13:
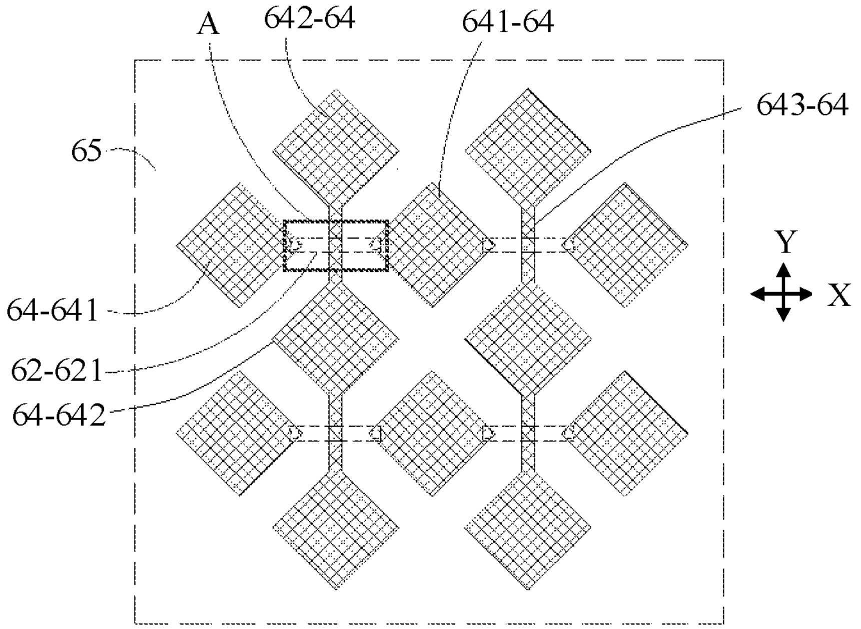
FIG. 13 is a partial top view of a touch layer in an embodiment of a display panel of the present disclosure.
Figure 14:
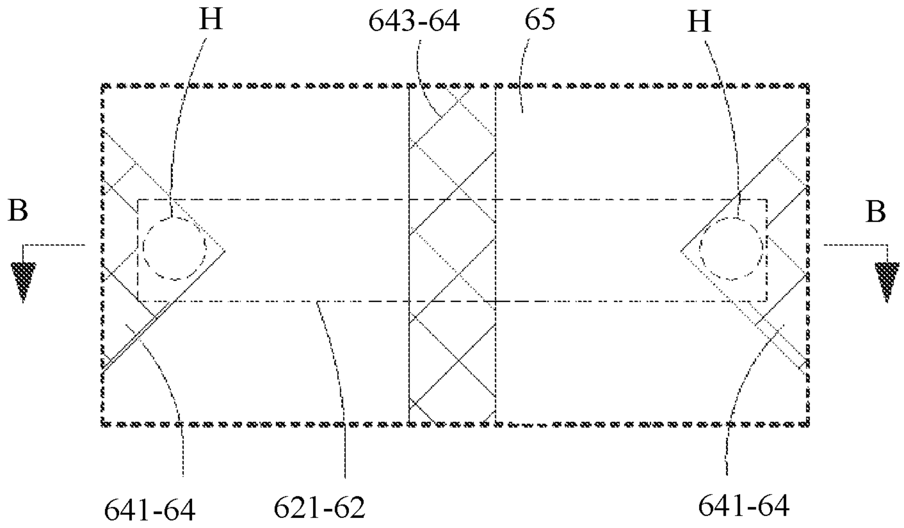
FIG. 14 is an enlarged view of portion A in FIG. 13.
Figure 15:
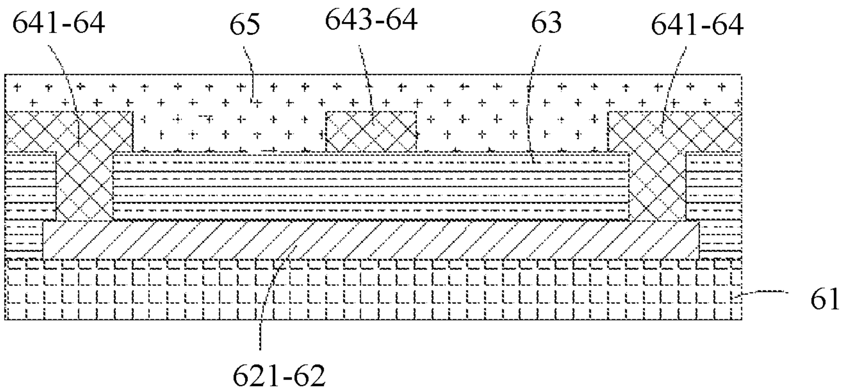
FIG. 15 is a B-B cross-sectional view of FIG. 14.

Further, as shown in FIGS. 13-15, the first conductive layer 62 may include a plurality of first connection bridges 621 distributed at intervals which may extend along a first direction X. Each via hole H exposes a partial area of the first connection bridge 621, the same first connection bridge 621 is exposed by two via holes H, and the two via holes H expose different areas of the first connection bridge 621, respectively, so that the two via holes H can be coupled through one first connection bridge 621. In addition, the same first connection bridge 621 may also be exposed by the plurality of via holes H.

The second conductive layer 64 may include a second connection bridge 643 and a plurality of first touch electrodes 641 and a plurality of second touch electrodes 642 insulated from each other, that is, the second connection bridge 643, the first touch electrodes 641 and the second touch electrodes 642 are different areas of the same conductive film layer. Two first touch electrodes 641 adjacent to each other in the first direction X can be coupled to the same first connection bridge 621 through different via holes H. Two second touch electrodes 642 adjacent to each other in a second direction Y may be coupled by one second connection bridge 643, and the second connection bridge 643 may extend along the second direction Y. The first direction X and the second direction Y are mutually intersecting directions, for example, the first direction X and the second direction Y are perpendicular to each other. The touch position can be determined by sensing a change in capacitance between the first touch electrode 641 and the second touch electrode 642.

One of the first touch electrode 641 and the second touch electrode 642 is a transmitting (TX) electrode, and the other is a receiving (RX) electrode, and materials of both the first touch electrode 641 and the second touch electrode 642 can be metals such as silver and copper or alloys. It should be noted that other conductive materials can also be used.

In other embodiments of the present disclosure, the first touch electrode 641, the second touch electrode 642 and the second connection bridge 643 can also be formed on the first conductive layer 62, and the first connection bridge 621 is formed on the second conductive layer 64.

As shown in FIG. 1, metal traces or electrodes on the driving backplane 1 and the light emitting layer 2 can reflect the external light, which affects the display effect, and therefore, the circularly polarization layer 4 can be used to reduce the reflection. Specifically, the circularly polarization layer 4 can be disposed on the side of the light emitting layer 2 away from the driving backplane 1, for example, the circularly polarization layer 4 can be disposed on a side of the touch layer 6 away from the driving backplane 1, and moreover, the circularly polarization layer 4 can be disposed on a surface of the protective layer 65 away from the driving backplane 1. The circularly polarization layer 4 is configured to convert the light incident from the side of the circularly polarization layer 4 away from the driving backplane 1 into the circularly polarized light in the first handedness, and convert light incident from a side of the circularly polarization layer 4 close to the light emitting devices 20 into linearly polarized light.

As shown in FIG. 1, in some embodiments of the present disclosure, the circularly polarization layer 4 may include a linearly polarization layer 41 and a phase retardation layer 42. The phase retardation layer 42 may be disposed on the side of the touch layer 6 away from the driving backplane 1, and may be a λ/4 wave plate. The linearly polarization layer 41 can be disposed on a side of the phase retardation layer 42 away from the driving backplane 1, and can be bonded to the phase retardation layer 42.

As shown in FIG. 12, the ambient light can be partially blocked when passing through the linearly polarization layer 41 and converted into the linearly polarized light, and then can be partially blocked when passing through the phase retardation layer 42, so that the linearly polarized light can be converted into the circularly polarized light. That is, the linearly polarization layer 41 can only allow the linearly polarized light to be transmitted, while the phase retardation layer 42 can convert the linearly polarized light into the circularly polarized light to be transmitted. Further, the circularly polarized light transmitted by the phase retardation layer 42 is the circularly polarized light in the first handedness. In addition, the light emitted by the light emitting device 20 is converted into the linearly polarized light when passing through the phase retardation layer 42, and part of the linearly polarized light is removed when passing through the linearly polarization layer 41, only part of the linearly polarized light can be emitted from the linearly polarization layer 41. A specific working principle of the circularly polarization plate will not be described in detail here.

In addition, as shown in FIG. 1, in some embodiments of the present disclosure, the display panel may further include a photosensitive device 7, the photosensitive device 7 may be disposed within the driving backplane 1 and is configured to sense a light intensity of light incident from a side of the driving backplane 1 close to the light emitting layer 2 and irradiated to the photosensitive device as a light intensity of the ambient light, so that brightness of the light emitting device 20 can be adjusted according to the light intensity of the ambient light to obtain an optimal display effect. In addition, the light intensity of the ambient light can also be used for other purposes, which is not particularly limited here.

In some embodiments of the present disclosure, the photosensitive device 7 may also be disposed on a side of the driving backplane 1 away from the light emitting layer 2, for example, the photosensitive device 7 may be disposed on a side of the substrate away from the light emitting layer 2.

There may be a plurality of photosensitive devices 7, and in order to ensure that they can receive the light, the pixel definition layer 21 can be made of a transparent material, and the photosensitive devices 7 can be disposed in areas corresponding to the pixel definition layer 21. The photosensitive device 7 can be a photoelectric sensor, and its specific structure is not particularly limited herein.

A solution for improving the light extraction efficiency of the display panel of the present disclosure will be described in detail below.

Through a lot of experiments and analysis, the inventor proposed a scheme of using chiral liquid crystal to improve the light extraction efficiency of the display panel and avoid an increase of power consumption. Specifically, as shown in FIG. 1, the chiral liquid crystal layer 3 can be disposed between the circularly polarization layer 4 and the light emitting layer 2. For example, the chiral liquid crystal layer 3 is disposed on the side of the touch layer 6 away from the driving backplane 1, and furthermore, the chiral liquid crystal layer 3 can be disposed on a side of the protective layer 65 of the touch layer 6 away from the driving backplane 1.

In addition, the chiral liquid crystal layer 3 can also be disposed in other positions. For example, the chiral liquid crystal layer 3 can also be disposed between the protective layer 65 and the isolation layer 63, or the chiral liquid crystal layer 3 can also be disposed between the buffer layer 61 and the isolation layers 63, or the chiral liquid crystal layer 3 can also be disposed between the buffer layer 61 and the encapsulation layer 5.

In addition, a refractive index of the chiral liquid crystal layer 3 may be greater than a refractive index of a film layer directly in contact with the chiral liquid crystal layer 3 on a side of the chiral liquid crystal layer 3 close to the driving backplane 1. In combination with the above-mentioned different positions of the chiral liquid crystal layer 3, the film layer can be the protective layer 65, the isolation layer 63, the buffer layer 61 or the encapsulation layer 5, etc. . . .

As shown in FIGS. 11 and 12, a central reflection wavelength of the chiral liquid crystal layer 3 is the same or approximately the same as a wavelength of the light of the first color. In addition, due to directionality of spiral of a chiral liquid crystal molecule, only the light of the first color whose polarization direction is consistent with a spiral direction of the chiral liquid crystal molecule will be reflected by the chiral liquid crystal layer 3, while the light of the first color whose polarization direction is different from the spiral direction of the chiral liquid crystal molecule may be transmitted by the chiral liquid crystal layer 3. That is to say, the light of the first color in the first handedness R can be transmitted by the chiral liquid crystal layer 3, while the light of the first color in the second handedness L can be reflected by the chiral liquid crystal layer 3. The first handedness R is opposite to the second handedness L. In addition, the chiral liquid crystal molecule can transmit the light of the second color and the light of the third color.

As shown in FIG. 11, for example, the first handedness is right-handed, the second handed is left-handed, the spiral direction of the chiral liquid crystal layer 3 is right-handed, the first color is blue, the second color is red, and the third color is green. The blue light emitted by the first light emitting device 20B may include left-handed blue light and right-handed blue light, the left-handed blue light can directly be transmitted by the chiral liquid crystal layer 3 and can be emitted through the circularly polarization plate, while the right-handed blue light is reflected by the chiral liquid crystal layer 3. Through multiple reflections by the light emitting layer 2, the driving backplane 1 and the chiral liquid crystal layer 3, the right-handed blue light can be converted into the left-handed blue light, which can be emitted from the chiral liquid crystal layer 3, thereby improving the light extraction efficiency of the blue light. Meanwhile, wavelengths of the red light and the green light are different from the central reflection wavelength of the chiral liquid crystal layer 3, and thus the red light and the green light can be transmitted by the chiral liquid crystal layer 3. In addition, if the spiral direction of the chiral liquid crystal layer 3 is left-handed, the left-handed blue light is reflected by the chiral liquid crystal layer 3, and the right-handed blue light can be transmitted by the chiral liquid crystal layer 3.

However, since the reflection between the chiral liquid crystal layer 3 and the light emitting layer 2 and the reflection between the chiral liquid crystal layer 3 and the driving backplane 1 can convert the handedness of the light of the first color, the light of the first color in the second handedness that cannot be transmitted by the chiral liquid crystal layer 3 is converted into the light of the first color in the first handedness and is emitted from the chiral liquid crystal layer 3, so that the light extraction efficiency of the light of the first color is improved, and the reflectivity of the light of the first color in the ambient light is increased, which affects the display effect.

Therefore, as shown in FIGS. 2-10, a filter layer 8 can be disposed between the driving backplane 1 and the chiral liquid crystal layer 3, and the filter layer 8 can absorb the light of the first color, so that the light of the first color cannot be reflected by the light emitting layer 2 and the driving backplane 1, thereby reducing the reflectivity of the light of the first color by the display panel. Meanwhile, the filter layer 8 can transmit the light of the second color and the light of the third color, so as to avoid reducing the light extraction efficiency of the light of the second color and the light of the third color.

As shown in FIG. 11 and FIG. 12, the filter layer 8 may be opened with a plurality of through holes 81 that can transmit the light, which at least includes a first through hole 81B corresponding to the first light emitting device 20B. An area of an orthographic projection of the first light emitting device 20B on the driving backplane 1 is approximately the same as an area of an orthographic projection of the first through hole 81B on the driving backplane 1, so as to ensure the light of the first color emitted by the first light emitting device 20B can pass through the filter layer 8, while an area without the first through hole 81B cannot transmit the light of the first color, so as to prevent the light of the first color in the ambient light from being reflected by the light emitting layer 2 and the driving backplane 1. For example, the orthographic projections of the first light emitting devices 20B on the driving backplane 1 are located within the orthographic projections of respective first through holes 81B on the driving backplane 1 in a one-to-one correspondence, that is, the area of the orthographic projection of the first light emitting device 20B on the driving backplane 1 is not larger than the area of the orthographic projection of the first through hole 81B on the driving backplane 1 to prevent the filter layer 8 from blocking the first light emitting device 20B in a direction perpendicular to the driving backplane 1. It should be noted that the area of the orthographic projection of the first light emitting device 20B on the driving backplane 1 may also be larger than the area of the orthographic projection of the first through hole 81B on the driving backplane 1, as long as the emitting of the light can be guaranteed.

In some embodiments of the present disclosure, the first color is blue, the second color is red, and the third color is green. The filter layer 8 can be a yellow filter material, which can transmit the red light and the green light and absorb the blue light. A specific material of the filter layer 8 is not particularly limited here, and its transmittance to the red light and the green light depends on its material and radian. For example, the transmittance of the filter layer 8 for the red light and the green light is 98%.

In order to ensure the filtering effect, a thickness of the filter layer 8 is not smaller than 1.5 μm, and meanwhile, in order to avoid a great influence on the transmittance to the light, the thickness of the filter layer 8 is not greater than 3.0 μm. For example, the thickness of the filter layer 8 may be 1.5 μm, 2 μm, 2.5 μm, 3 μm, etc., which is not particularly limited here.

There may be many ways to dispose the filter layer 8 between the driving backplane 1 and the chiral liquid crystal layer 3, which are exemplified below.

Figure 2:
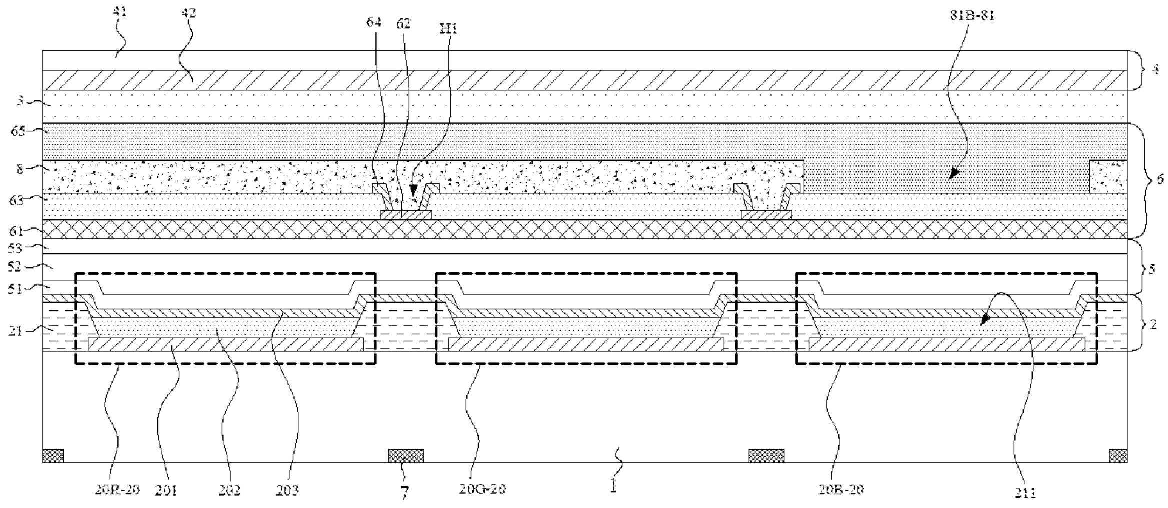
FIG. 2 is a schematic diagram of a second embodiment of a display panel of the present disclosure.

As shown in FIG. 2, in some embodiments of the present disclosure, the filter layer 8 can be disposed within the touch layer 6. For example, based on the above-mentioned embodiments of the touch layer 6, the filter layer 8 can be used to cover the second conductive layer 64 and the isolation layer 63, and the protective layer 65 of the touch layer 6 can cover the filter layer 8.

Figure 3:
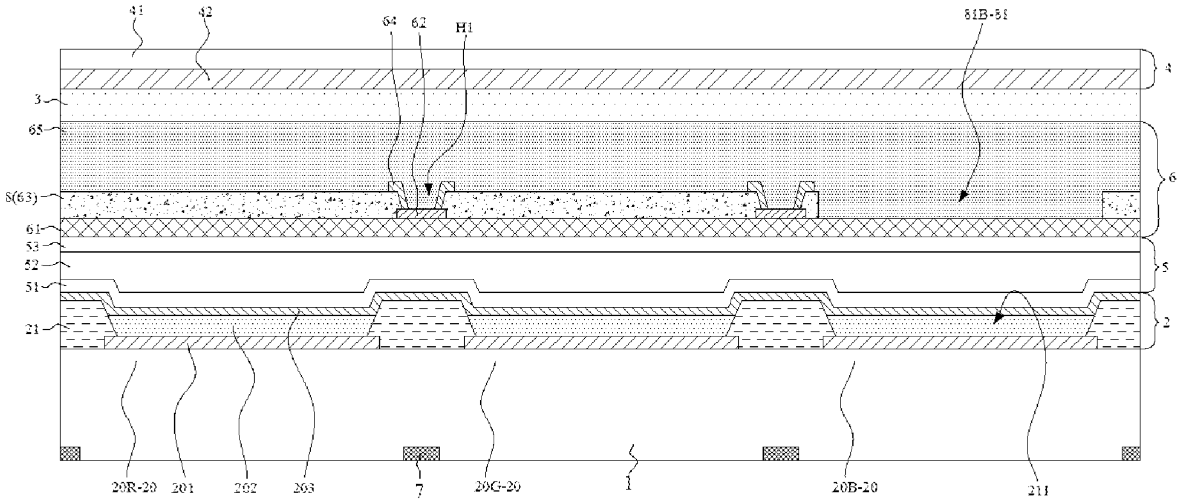
FIG. 3 is a schematic diagram of a third embodiment of a display panel of the present disclosure.

As shown in FIG. 3, in some embodiments of the present disclosure, the filter layer 8 can be used to replace the isolation layer 63 of the touch layer 6, and plays the role of both the filter layer 8 and the isolation layer 63, so that the isolation layer 63 is omitted, in order to simplify the process and reduce the cost.

For example, the filter layer 8 can be used to cover the first conductive layer 62 without using the isolation layer 63. Meanwhile, the filter layer 8 can be provided with the via hole H exposing the partial area of the first conductive layer 62, and the via hole H is the same as the via hole H disposed in the isolation layer 63, which will not be described in detail here. In addition, the through hole 81 of the filter layer 8 and the via hole H of the filter layer 8 are distributed at an interval. The protective layer 65 may cover the second conductive layer 64 and the filter layer 8. A detailed structure of the touch layer 6 has been described above, and will not be repeated here.

Figure 4:
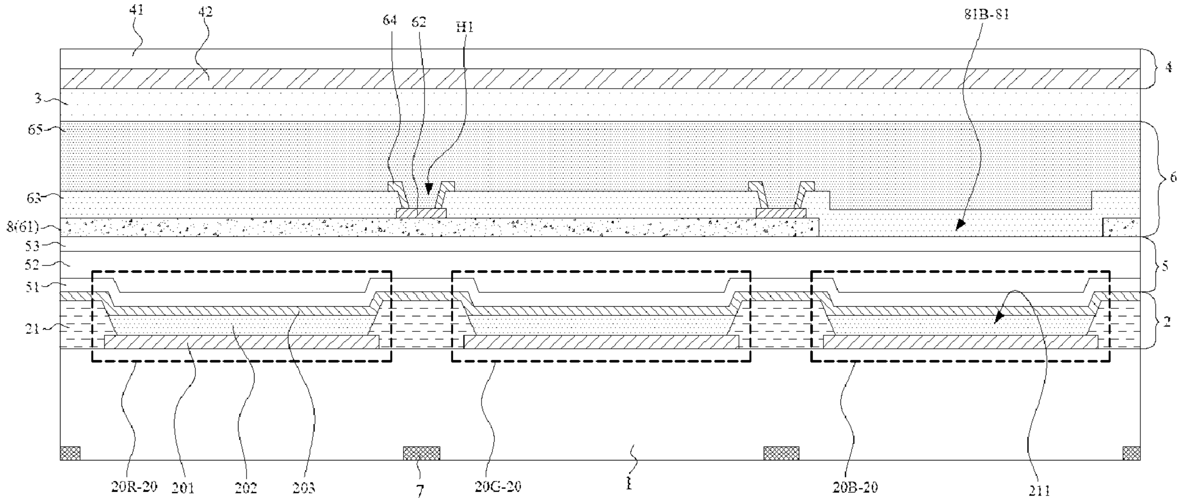
FIG. 4 is a schematic diagram of a fourth embodiment of a display panel of the present disclosure.

As shown in FIG. 4, in some embodiments of the present disclosure, the filter layer 8 can be used to replace the buffer layer 61 of the touch layer 6, and plays the role of both the filter layer 8 and the buffer layer 61, so that the buffer layer 61 is omitted, in order to simplify the process and reduce the cost.

For example, the filter layer 8 can be disposed between the light emitting layer 2 and the chiral liquid crystal layer 3, for example, the filter layer 8 can be disposed on a surface of the second inorganic layer 53 of the encapsulation layer 5 away from the driving backplane 1.

The first conductive layer 62 of the touch layer 6 can be disposed on a surface of the filter layer 8 away from the driving backplane 1, and the filter layer 8 can function as the buffer layer 61 to prevent impurities on a side of the filter layer 8 close to the driving backplane 1 from diffusing to the first conductive layer 62, so that the disposing of the buffer layer 61 can be avoided. The detailed structure of the touch layer 6 has been described above, and will not be repeated here.

In other embodiments of the present disclosure, both the buffer layer 61 and the isolation layer 63 can be replaced by the filter layer 8, but the filter layer 8 can be formed by two stacked sub-layers, one sub-layer replaces the buffer layer 61, and the other sub-layer replaces the isolation layer 63.

It should be noted that, in addition to the above-mentioned embodiments in which the filter layer 8 is disposed inside the touch layer 6, the present disclosure also includes an embodiment in which the filter layer 8 is disposed outside the touch layer 6, which is exemplified below.

Figure 5:
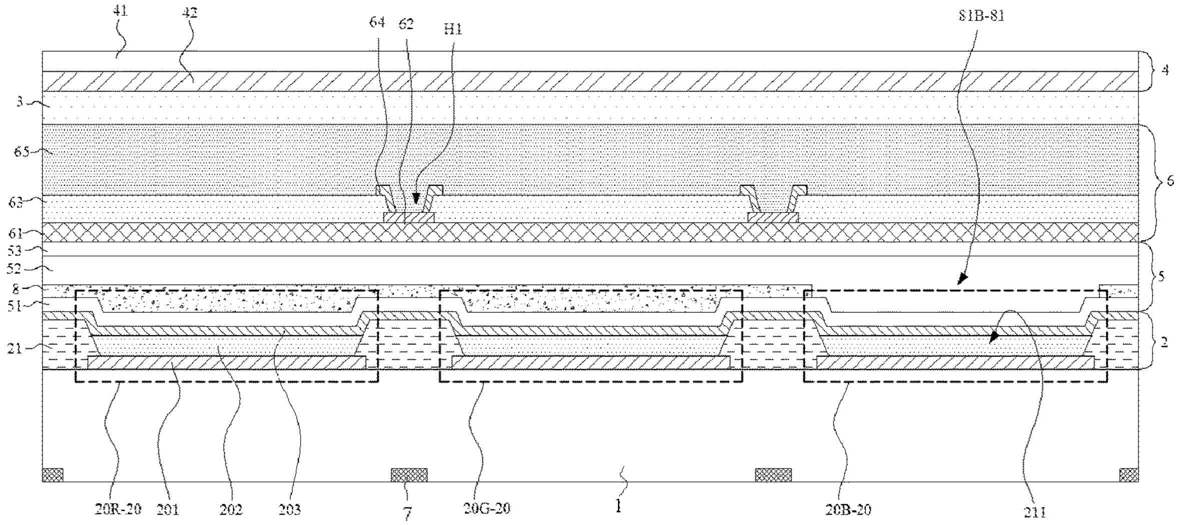
FIG. 5 is a schematic diagram of a fifth embodiment of a display panel of the present disclosure.

As shown in FIG. 5, in some embodiments of the present disclosure, the touch layer 6 can be disposed on a side of the filter layer 8 away from the driving backplane 1, for example, the filter layer 8 can be disposed within the encapsulation layer 5.

Specifically, the filter layer 8 can be disposed on the surface of the first inorganic layer 51 away from the driving backplane 1, and a boundary of the filter layer 8 can be aligned with the boundary of the first inorganic layer 51, that is, the filter layer 8 is used to cover the surface of the first inorganic layer 51 away from the driving backplane 1. The organic layer 52 can be disposed on the surface of the filter layer 8 away from the driving backplane 1, but the boundary of the organic layer 52 is located inside the boundary of the filter layer 8, so that part of the filter layer 8 is exposed. The second inorganic layer 53 covers the organic layer 52 and the filter layer 8 not covered by the organic layer 52, so that the organic layer 52 is enclosed between the second inorganic layer 53 and the filter layer 8. In addition, the touch layer 6 can be disposed on the surface of the second inorganic layer 53 away from the driving backplane 1.

It should be noted that, for the filter layer 8 in any of the above embodiments, the through hole 81 may only include the first through hole 81B, that is, only the first through hole 81B may be opened in the filter layer 8. It should be noted that the through hole 81 may also include the first through hole 81B, a second through hole 81R and a third through hole 81G, that is, the filter layer 8 may be opened with the first through hole 81B, the second through hole 81R and the third through hole 81G.

As shown in FIGS. 7-10, in some embodiments of the present disclosure, in order to further improve the light extraction efficiency, the through hole 81 may further include the second through hole 81R and the third through hole 81G, the second through hole 81R corresponds to the second light emitting device 20R, and the third through hole 81G corresponds to the third light emitting device 20G. That is, orthographic projections of the second light emitting devices 20R on the driving backplane 1 are located within orthographic projections of respective second through holes 81R on the driving backplane 1 in a one-to-one correspondence, and orthographic projections of the third light emitting devices 20G on the driving backplane 1 are located within orthographic projections of respective third through holes 81G on the driving backplane 1 in a one-to-one correspondence. In this way, it is possible to prevent the filter layer 8 from blocking the light emitted by each light emitting device 20, thereby improving the light extraction efficiency. The embodiments of FIGS. 7-10 are obtained by adding the second through hole 81R and the third through hole 81G to the embodiments of FIGS. 2-5, respectively.

Figure 6:
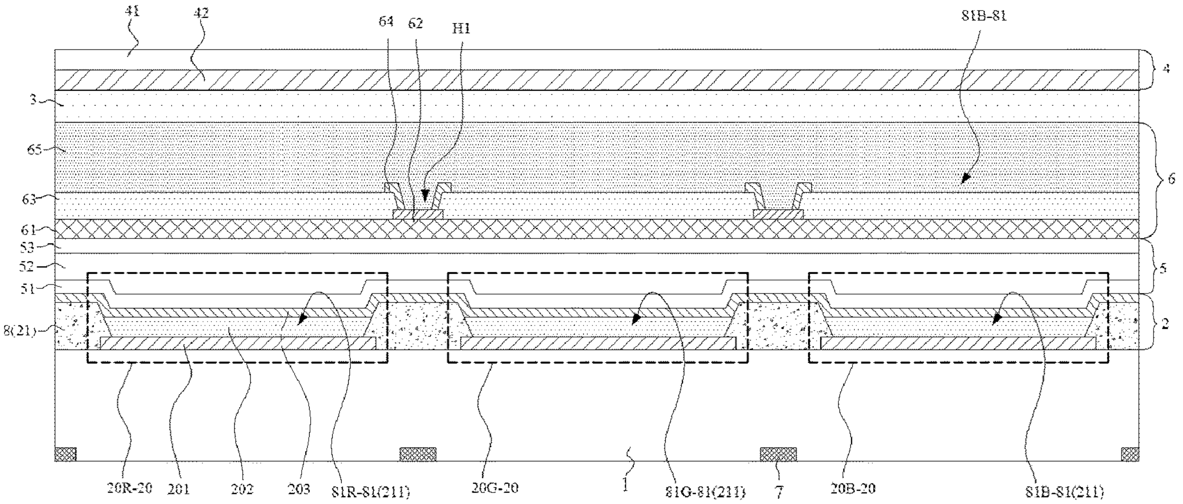
FIG. 6 is a schematic diagram of a sixth embodiment of a display panel of the present disclosure.
Figure 7:
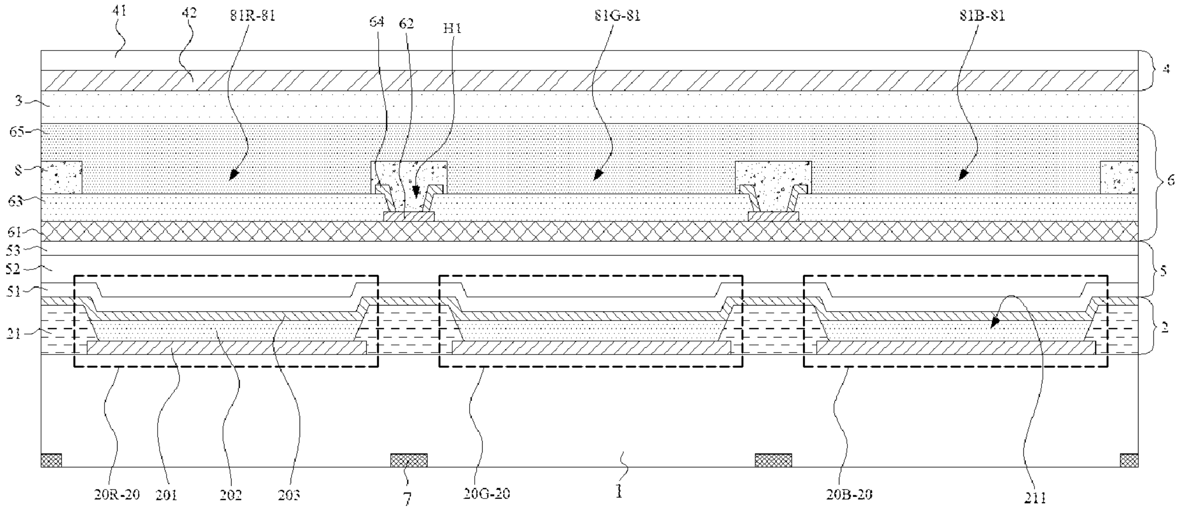
FIG. 7 is a schematic diagram of a seventh embodiment of a display panel of the present disclosure.
Figure 8:
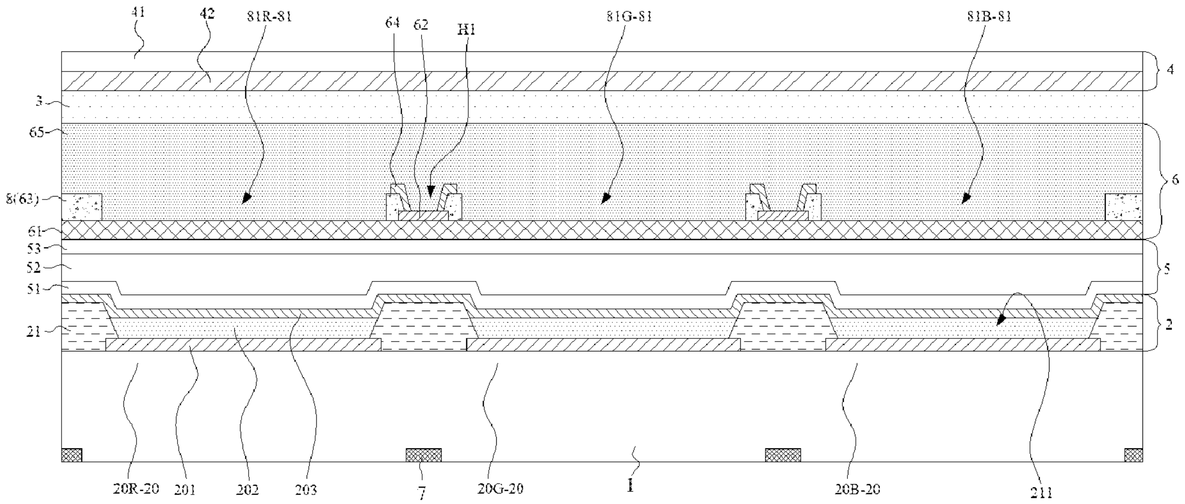
FIG. 8 is a schematic diagram of an eighth embodiment of a display panel of the present disclosure.
Figure 9:
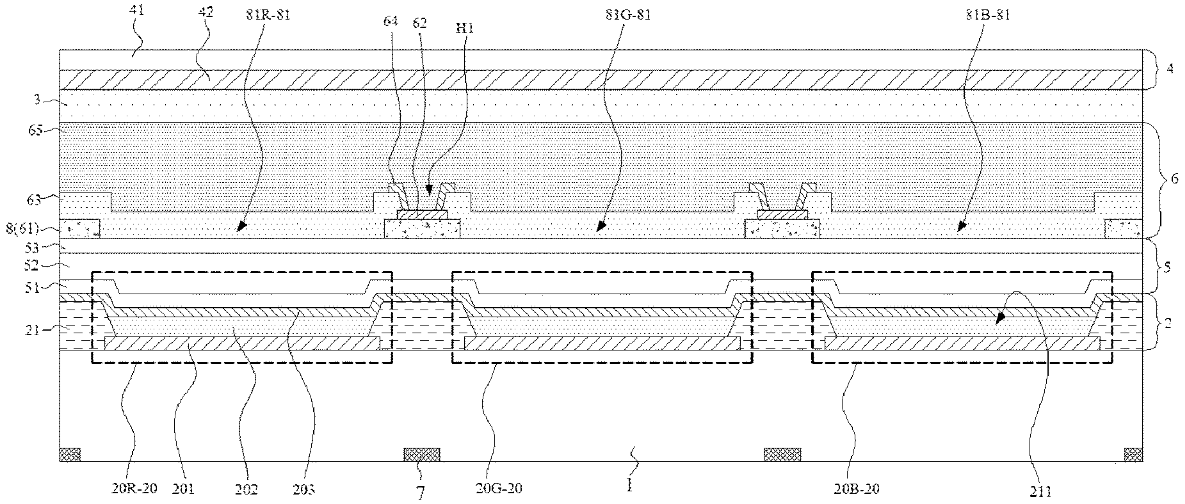
FIG. 9 is a schematic diagram of a ninth embodiment of a display panel of the present disclosure.
Figure 10:
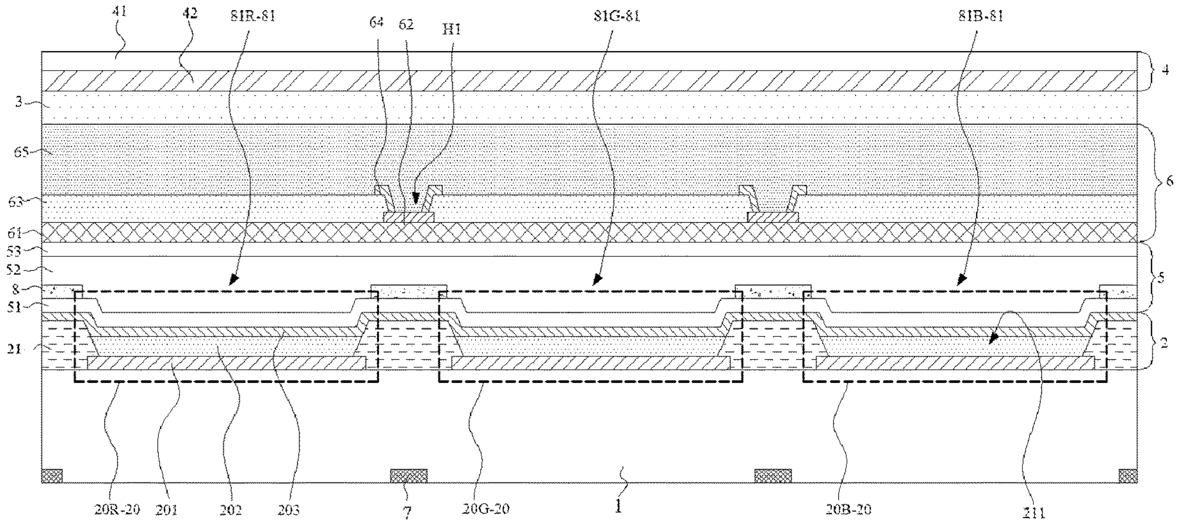
FIG. 10 is a schematic diagram of a tenth embodiment of a display panel of the present disclosure.

As shown in FIG. 6, in some embodiments of the present disclosure, the filter layer 8 can be disposed within the light emitting layer 2, and the filter layer 8 can be used to replace the pixel definition layer 21. In addition to playing the role of absorbing the light of the first color, the filter layer 8 can also play the role of separating individual light emitting devices 20, so that the pixel definition layer 21 can be omitted, so as to simplify the structure and process.

For example, the filter layer 8 can be used to cover the first electrode 201 layer and an area of the driving backplane 1 that is not covered by the first electrode 201 layer. The through holes 81 of the filter layer 8 can expose the respective first electrodes 201 in a one-to-one correspondence. The through hole 81 may function as the opening 211 of the pixel definition layer 21. In this case, the through hole 81 includes the first through hole 81B corresponding to the first light emitting device 20B, the second through hole 81R corresponding to the second light emitting device 20R and the third through hole 81G corresponding to the third light emitting device 20G. The light emitting functional layer 202 can be disposed in each through hole 81, and light emitting functional layers 202 in adjacent through holes 81 are distributed at intervals. The second electrode 203 may cover the light emitting functional layer 202 and may also cover the filter layer 8. One light emitting device 20 includes the first electrode 201, the light emitting functional layer 202 and the second electrode 203 corresponding to the same through hole 81. A light emitting layer 2 in which the filter layer 8 is used to separate the light emitting devices 20 has the same principle as the light emitting layer 2 in which the pixel definition layer 21 is used to separate the light emitting devices 20, and the difference is that the pixel definition layer 21 is replaced by the filter layer 8.

The embodiments of the present disclosure further provide a manufacturing method for a display panel, the display panel may be the display panel of any of the above embodiments, and its structure will not be described in detail here. As shown in FIGS. 1 to 12, and 17, the manufacturing method of the present disclosure may include steps S110 to S140.

In the step S110, a driving backplane is formed.

In the step S120, a light emitting layer is formed on a side of the driving backplane, and the light emitting layer includes a plurality of light emitting devices that include a first light emitting device that emits light of a first color.

In the step S130, a chiral liquid crystal layer is formed on a side of the light emitting layer away from the driving backplane, the chiral liquid crystal layer is configured to transmit circularly polarized light of the first color in a first handedness and reflect circularly polarized light of the first color in a second handedness, and the first handedness is opposite to the second handedness.

In the step S140, a circularly polarization layer is formed on a side of the chiral liquid crystal layer away from the driving backplane, and the circularly polarization layer is configured to convert light incident from a side of the circularly polarization layer away from the driving backplane into the circularly polarized light in the first handedness, and convert light incident from a side of the circularly polarization layer close to the light emitting device into linearly polarized light.

In some embodiments of the present disclosure, after the driving backplane is formed and before the chiral liquid crystal layer is formed, that is, after the step S110 and before the step S130, the manufacturing method of the present disclosure may further include:

- in step S150, a filter layer 8 provided with a plurality of through holes 81 is formed on the side of the driving backplane, the through holes 81 include a first through hole 81B corresponding to the first light emitting device, and the filter layer 8 is configured to absorb the light of the first color.

In some embodiments of the present disclosure, the filter layer 8 is located between the light emitting layer and the chiral liquid crystal layer, and correspondingly, the forming the filter layer 8 provided with the plurality of through holes 81 on the side of the driving backplane, that is, the step S150, may include steps S1510 and S1520.

In the step S1510, a filter material layer capable of absorbing the light of the first color is formed on the side of the light emitting layer away from the driving backplane.

In the step S1520, the filter material layer is exposed and developed to obtain the filter layer 8 provided with the plurality of through holes 81, and the through holes 81 include the first through hole 81B corresponding to the first light emitting device.

In some embodiments of the present disclosure, the filter layer 8 is located within the light emitting layer, and can replace the pixel definition layer. Correspondingly, after a first electrode of the light emitting layer is formed, the filter layer 8 that exposes each first electrode through the through hole 81 can be formed, and then a light emitting functional layer and a second electrode are formed. A process for forming the filter layer 8 can be still a photolithography process, and reference can be specifically made to the above-mentioned steps S1510 and S1520, which will not be described in detail here.

A specific position and structure of the filter layer 8 have been exemplified in various embodiments of the display panel above. For details, reference may be made to the above embodiments, which will not be described in detail here.

It should be noted that although various steps of the manufacturing method in the present disclosure are described in a particular order in the drawings, this is not required or implied that these steps must be performed in the particular order, or all the steps shown must be performed to achieve a desired result. Additionally or alternatively, certain steps may be omitted, multiple steps may be combined into one step for execution, and/or one step may be decomposed into multiple steps for execution, and so on.

The embodiments of the present disclosure further provide a display device, and the display device may include the display panel of any of the above-mentioned embodiments, and for its specific structure and beneficial effects, reference can be made to the display panel embodiments, which will not be repeated here. The display device may be an electronic device with an image display function, such as a mobile phone, a tablet computer, a TV, etc., which will not be listed one by one here.

Other embodiments of the present disclosure will be apparent to those skilled in the art from consideration of the specification and practice of the present disclosure disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:

a driving backplane;

a light emitting layer, disposed on a side of the driving backplane, and comprising a plurality of light emitting devices comprising a first light emitting device by which light of a first color is emitted;

a chiral liquid crystal layer, disposed on a side of the light emitting layer away from the driving backplane, wherein the chiral liquid crystal layer is configured to transmit circularly polarized light of the first color in a first handedness and reflect circularly polarized light of the first color in a second handedness, and the first handedness is opposite to the second handedness; and a circularly polarization layer, disposed on a side of the chiral liquid crystal layer away from the driving backplane, wherein the circularly polarization layer is configured to convert light incident from a side of the circularly polarization layer away from the driving backplane into circularly polarized light in the first handedness, and convert light incident from a side of the circularly polarization layer close to the light emitting layer into linearly polarized light, wherein the display panel further comprises:

a filter layer, wherein the filter layer is disposed between the light emitting layer and the chiral liquid crystal layer, a buffering function and a filtering function are provided by the filter layer, the filter layer is provided with a plurality of openings comprising a first through hole corresponding to the first light emitting device, and the filter layer is configured to absorb the light of the first color;

wherein the display panel further comprises a touch layer, and the touch layer comprises:

a first conductive layer, disposed on a surface of the filter layer away from the driving backplane;

an isolation layer, by which the first conductive layer is covered and provided with a via hole by which a partial area of the first conductive layer is exposed;

a second conductive layer, disposed on a surface of the isolation layer away from the driving backplane, and coupled to the first conductive layer through the via hole; and a protective layer, by which the second conductive layer and the isolation layer are covered, wherein the chiral liquid crystal layer is disposed on a side of the protective layer away from the driving backplane, the protective layer is in direct contact with the chiral liquid crystal layer, and a refractive index of the chiral liquid crystal layer is greater than a refractive index of the protective layer.

2. The display panel according to claim 1, wherein the light emitting devices further comprise a second light emitting device that emits light of a second color and a third light emitting device that emits light of a third color; and the openings further comprise a second through hole corresponding to the second light emitting device and a third through hole corresponding to the third light emitting device.

3. The display panel according to claim 2, wherein the first color is blue, the second color is red, and the third color is green; and the filter layer is made of a yellow filter material.

4. The display panel according to claim 1, wherein a thickness of the filter layer is not smaller than 1.5 μm and not greater than 3.0 μm.

5. The display panel according to claim 1, wherein the display panel further comprises:

a photosensitive device, disposed on a side of the driving backplane away from the light emitting layer, or disposed within the driving backplane, wherein the photosensitive device is configured to sense a light intensity of light incident from a side of the driving backplane close to the light emitting layer and irradiated to the photosensitive device.

6. A manufacturing method for a display panel, comprising:

forming a driving backplane;

forming a light emitting layer on a side of the driving backplane, wherein the light emitting layer comprises a plurality of light emitting devices comprising a first light emitting device by which light of a first color is emitted;

forming a chiral liquid crystal layer on a side of the light emitting layer away from the driving backplane, wherein the chiral liquid crystal layer is configured to transmit circularly polarized light of the first color in a first handedness and reflect circularly polarized light of the first color in a second handedness, and the first handedness is opposite to the second handedness; and forming a circularly polarization layer on a side of the chiral liquid crystal layer away from the driving backplane, wherein the circularly polarization layer is configured to convert light incident from a side of the circularly polarization layer away from the driving backplane into circularly polarized light in the first handedness, and convert light incident from a side of the circularly polarization layer close to the light emitting device into linearly polarized light, wherein the manufacturing method further comprises:

forming a filter layer, wherein the filter layer is disposed between the light emitting layer and the chiral liquid crystal layer, and is provided with a plurality of openings comprising a first through hole corresponding to the first light emitting device, a buffering function and a filtering function are provided by the filter layer, and the filter layer is configured to absorb the light of the first color;

wherein the manufacturing method further comprises: forming a touch layer, and forming the touch layer further comprises:

forming a first conductive layer on a surface of the filter layer away from the driving backplane;

forming an isolation layer covering the first conductive layer, wherein the isolation layer is provided with a via hole by which a partial area of the first conductive layer is exposed;

forming a second conductive layer on a surface of the isolation layer away from the driving backplane, wherein the second conductive layer is coupled to the first conductive layer through the via hole; and forming a protective layer covering the second conductive layer and the isolation layer, wherein the chiral liquid crystal layer is disposed on a side of the protective layer away from the driving backplane, the protective layer is in direct contact with the chiral liquid crystal layer, and a refractive index of the chiral liquid crystal layer is greater than a refractive index of the protective layer.

7. A display device, comprising a display panel, wherein the display panel comprises:

a driving backplane;

a light emitting layer, disposed on a side of the driving backplane, and comprising a plurality of light emitting devices comprising a first light emitting device by which light of a first color is emitted;

a chiral liquid crystal layer, disposed on a side of the light emitting layer away from the driving backplane, wherein the chiral liquid crystal layer is configured to transmit circularly polarized light of the first color in a first handedness and reflect circularly polarized light of the first color in a second handedness, and the first handedness is opposite to the second handedness; and a circularly polarization layer, disposed on a side of the chiral liquid crystal layer away from the driving backplane, wherein the circularly polarization layer is configured to convert light incident from a side of the circularly polarization layer away from the driving backplane into circularly polarized light in the first handedness, and convert light incident from a side of the circularly polarization layer close to the light emitting layer into linearly polarized light, wherein the display panel further comprises:

a filter layer, wherein the filter layer is disposed between the light emitting layer and the chiral liquid crystal layer, a buffering function and a filtering function are provided by the filter layer, the filter layer is provided with a plurality of openings comprising a first through hole corresponding to the first light emitting device, and the filter layer is configured to absorb the light of the first color;

wherein the display panel further comprises a touch layer, and the touch layer comprises:

a first conductive layer, disposed on a surface of the filter layer away from the driving backplane;

an isolation layer, by which the first conductive layer is covered and provided with a via hole by which a partial area of the first conductive layer is exposed;

a second conductive layer, disposed on a surface of the isolation layer away from the driving backplane, and coupled to the first conductive layer through the via hole; and a protective layer, by which the second conductive layer and the isolation layer are covered, wherein the chiral liquid crystal layer is disposed on a side of the protective layer away from the driving backplane, the protective layer is in direct contact with the chiral liquid crystal layer, and a refractive index of the chiral liquid crystal layer is greater than a refractive index of the protective layer.

* * * * *